US012645158B2

(12) United States Patent
von Hodenberg et al.

(10) Patent No.: US 12,645,158 B2
(45) Date of Patent: Jun. 2, 2026

(54) OPTICAL SYSTEM, PROJECTION EXPOSURE SYSTEM AND METHOD

(71) Applicant: Carl Zeiss SMT GmbH, Oberkochen (DE)

(72) Inventors: Martin von Hodenberg, Oberkochen (DE); Toralf Gruner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 217 days.

(21) Appl. No.: 18/656,908

(22) Filed: May 7, 2024

(65) Prior Publication Data

US 2024/0288784 A1     Aug. 29, 2024

Related U.S. Application Data

(63) Continuation of application No. PCT/EP2022/079937, filed on Oct. 26, 2022.

(30) Foreign Application Priority Data

Nov. 18, 2021     (DE) ..................... 10 2021 212 971.4

(51) Int. Cl.
G03F 7/00          (2006.01)

(52) U.S. Cl.
CPC ........ G03F 7/70891 (2013.01); G03F 7/7025 (2013.01); G03F 7/70266 (2013.01)

(58) Field of Classification Search
CPC ... G02B 5/005; G03F 7/7025; G03F 7/70266; G03F 7/70891
See application file for complete search history.

(56) References Cited

U.S. PATENT DOCUMENTS

| | | | | |
|---|---|---|---|---|
| 5,311,249 A | * | 5/1994 | Kamon ................... | G03F 7/701 355/71 |
| 5,390,228 A | * | 2/1995 | Niibe .................. | G03F 7/70008 359/846 |
| 6,573,978 B1 | | 6/2003 | McGuire, Jr. | |
| 2003/0043352 A1 | * | 3/2003 | Sudoh ................. | G03F 7/70091 355/40 |
| 2004/0256574 A1 | * | 12/2004 | Namba ............... | G03F 7/70875 250/492.1 |

(Continued)

FOREIGN PATENT DOCUMENTS

| | | | |
|---|---|---|---|
| DE | 102008009600 A1 | 8/2009 | |
| DE | 102010040108 A1 | 3/2012 | |

(Continued)

OTHER PUBLICATIONS

Translation of International Search Report for corresponding PCT Appl No. PCT/EP2022/079937, dated Feb. 20, 2023.

*Primary Examiner* — Deoram Persaud

(74) *Attorney, Agent, or Firm* — Fish & Richardson P.C.

(57) ABSTRACT

An optical system for a projection exposure apparatus comprises: an obscuration stop, a stop for the numerical aperture or an extraneous light stop, at least portions of which are arranged in a beam path of the optical system to shade at least portions of the beam path; a heating device for introducing heat into the stop, the stop being deformable from an initial geometry into a design geometry with the aid of the introduction of the heat; and a temperature sensor, a photo element and/or an infrared camera.

21 Claims, 8 Drawing Sheets

(56)     References Cited

U.S. PATENT DOCUMENTS

| 2004/0262541 | A1* | 12/2004 | Honda ................... F25B 21/02 |
| | | | 250/492.2 |
| 2006/0132747 | A1 | 6/2006 | Singer et al. |
| 2018/0074303 | A1 | 3/2018 | Schwab |
| 2018/0275534 | A1* | 9/2018 | Coon ....................... G03F 1/64 |
| 2020/0272058 | A1 | 8/2020 | Bieling et al. |
| 2020/0363734 | A1* | 11/2020 | Shigenobu .......... G03F 7/70633 |
| 2022/0107567 | A1* | 4/2022 | Modeste ............... G02B 5/006 |
| 2023/0123115 | A1* | 4/2023 | Mueller ............... G03F 7/7025 |
| | | | 355/30 |
| 2025/0258444 | A1* | 8/2025 | Raba .................. G03F 7/70891 |

FOREIGN PATENT DOCUMENTS

| DE | 102017220586 | A1 | 5/2019 |
| DE | 102021212971 | A1 | 5/2023 |
| EP | 0532236 | A1 | 3/1993 |
| EP | 0678768 | A2 | 10/1995 |
| EP | 1477853 | A2 | 11/2004 |
| EP | 1614008 | B1 | 1/2006 |
| JP | 2010287747 | A | 12/2010 |
| JP | 201186708 | A | 4/2011 |
| WO | WO 2009124590 | A1 | 10/2009 |
| WO | WO 2012028303 | A1 | 3/2012 |
| WO | WO 2023088651 | A1 | 5/2023 |

* cited by examiner

S100

S200

S300

OPTICAL SYSTEM, PROJECTION EXPOSURE SYSTEM AND METHOD

CROSS-REFERENCE TO RELATED APPLICATIONS

The present application is a continuation of, and claims benefit under 35 USC 120 to, international application No. PCT/EP2022/079937, filed Oct. 26, 2022, which claims benefit under 35 USC 119 of German Application No. 10 2021 212 971.4, filed Nov. 18, 2021. The entire disclosure of each of these applications is incorporated by reference herein.

FIELD

The present disclosure relates to an optical system for a projection exposure apparatus, to a projection exposure apparatus having such an optical system, and to a method for operating such an optical system.

BACKGROUND

Microlithography is used to produce microstructured components, for example integrated circuits. The microlithography process is carried out using a lithography apparatus comprising an illumination system and a projection system. The image of a mask (reticle) illuminated via the illumination system is projected here via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 nm to 30 nm, such as 13.5 nm, are currently under development. In the case of such EUV lithography apparatuses, because of the high absorption of light of this wavelength by most materials, reflective optical units, that is to say mirrors, are usually used instead of—as previously—refractive optical units, that is to say lens elements.

Further, in addition to the mirrors, a projection system as mentioned above may also comprise stops which are able to shade at least portions of a beam path of the projection system. These stops serve to shape an exit pupil, in the form of aperture and obscuration stops, and, as extraneous light stops, serve to remove unwanted light from the image or from locations where it may lead to bothersome heating. The geometry of the stops can have a significant influence on the imaging quality.

An illumination system as mentioned above frequently operates with faceted mirrors or other components that bring about pupil faceting, for instance mixing rods or fly's eye condensers. The resultant discontinuous light distribution in the exit pupil can lead to a high sensitivity to the pupil curtailment by the respective stop because the energy is more localized in the angular space, and it can make a difference whether, for example, an EUV "star" (illumination spot) is cut off or allowed to pass and whether the light contributes in correspondingly interfering fashion to the imaging.

The stops are usually manufactured as thin metal parts, especially as sheet metals, with a defined shape. As dimensional precision is to be considered, these parts cost significantly more than would be expected given the input of material. If the stops now capture light according to the task at hand, they will absorb at least some of it and heat up as a result.

While aperture stops and extraneous light stops are usually located at the edge of the optical beam path and can consequently be thermally linked to the outside world via material with a large cross section, the situation is more difficult for an obscuration stop located in the middle of the beam path.

Such an obscuration stop can be kept in position with the aid of blade-shaped holders or wires. This holder, for example in the form of the aforementioned wires, blocks used light and is therefore designed to be as thin as possible. Since thermal conduction is proportional to the material cross section, the cooling effect for the obscuration stop via this link typically acts weakly.

Gas cooling is also low, especially in vacuo. According to the Stefan-Boltzmann law, radiative cooling only contributes to heat dissipation at relatively high temperatures. For example, if the assumption is made that power absorbed might be in an order of magnitude of approximately 1 W, then the obscuration stop can easily heat up by several 10 K in the static state.

Metallic coefficients of thermal expansion are in an order of magnitude of approximately 1E-5/K. The extension of an obscuration stop is in the order of magnitude of 10 mm. Hence, shape changes in the order of magnitude of micrometers or, converted to pupil coordinates, in the order of magnitude of 0.01 mσ to 0.1 mσ (1σ=full pupil) are to be expected.

On account of the discontinuous light distribution in the exit pupil mentioned above, such an apparently small value can already influence the imaging noticeably and, in an exemplary case with structure widths in the order of magnitude of 10 nm, bring about a change in structure size in the order of magnitude of 5 pm. A significant contribution to the budget arises here if the assumption is made that the structure sizes and hence their tolerances reduce in perspective while the irradiation powers increase at the same time.

SUMMARY

The present disclosure seeks to provide an improved optical system for a projection exposure apparatus.

Accordingly, in an aspect, an optical system for a projection exposure apparatus is proposed. The optical system comprises a stop, such as an obscuration stop, a stop for the numerical aperture or an extraneous light stop, at least portions of which are arranged in a beam path of the optical system, in order to shade at least portions of the beam path, and a heating device for introducing heat into the stop, the stop being deformable from an initial geometry into a design geometry with the aid of the introduction of the heat. The optical system also comprises a temperature sensor, a photo element and/or an infrared camera, with an open-loop and closed-loop control device of the optical system being configured to determine a local stop temperature distribution of the stop on the basis of measurement signals from the temperature sensor, the photo element and/or the infrared camera and/or on the basis of information relating to a temperature distribution of further optical elements arranged at a comparable position to the stop in the beam path, and to control the heating device in such a way that a target stop temperature distribution of the stop is obtainable.

The provision of the heating device can make it possible to compensate changes in the absorbed used power, and hence temperature variations. Structure size variations and telecentricity errors on account of varying stop geometry can be substantially eliminated as a result. This can yield a stable imaging behavior. Furthermore, it is also possible to use the targeted introduction of the heat into the stop to deliberately influence structure sizes or structure layers by virtue of using a temperature of the stop as a manipulator and adapting the design geometry of the stop to a given imaging situation using the heating device.

The optical system can be a projection optical unit of the projection exposure apparatus. Accordingly, the optical system can also be referred to as projection optical unit. The optical system may comprise a plurality of optical elements, for example mirrors, such as EUV mirrors. Illumination radiation or operating light follows the beam path of the optical system through the optical system. In so doing, the illumination radiation or the operating light is reflected at the optical elements. The stop absorbs some of the illumination radiation. In the process, heat is introduced into the stop. The stop for the numerical aperture may also be referred to as numerical aperture stop. In particular, this means that the terms "numerical aperture stop" and "stop for the numerical aperture" can be interchanged as desired.

With the aid of the stop, it is possible to shade the beam path at least in part in order to shape the latter in the process. The stop covers parts of the beam path, with the result that the illumination radiation is incident on the stop. In the present case, "at least portions" of the stop being arranged in the beam path means in particular that the stop protrudes into the beam path. In so doing, the stop may protrude into the beam path from the side and trim the latter laterally. However, the stop may also be arranged fully in the beam path. The stop can be a stop for the numerical aperture, an obscuration stop or an extraneous light stop. The stop comprises a light-determining edge. The light-determining edge can be closed or enclosing. However, the light-determining edge can also be open.

In the initial geometry, the stop is shaped here in such a way that, when the thermal expansion occurring in the process is taken into account, the stop adopts the design geometry in the case of a maximally absorbed power. The heating device is suitable for introducing the heat into the stop. To this end, the heating device can heat the stop, for example with the aid of electromagnetic radiation, such as infrared radiation. Resistance heating is also possible in an alternative or in addition.

There is a heat-related deformation of the stop due to the introduction of the heat. For example, there can be a heat-related expansion of the stop. To this end, the stop can be manufactured from a metallic substance. In the present case, the "initial geometry" or "initial shape" should be understood to mean a geometry or shape of the stop, in particular of the light-determining edge of the stop, prior to the introduction of heat into the stop. In the present case, the "design geometry" or "design shape" should be understood to mean a geometry or a shape of the stop, in particular of the light-determining edge of the stop, used for a stable and reproducible imaging behavior.

The stop can be planar or in the form of a sheet. The stop can be manufactured from a metallic substance which is able to expand due to heat. For example, the stop can be manufactured from a steel sheet or aluminum sheet. The stop can be manufactured from the same material throughout. Alternatively, it is also possible to construct the stop layer-by-layer from multiple elements that are manufactured from different metallic substances. As a result, the stop can be realized as a bimetal element or bimetal stop. This makes it possible to realize an increased actuation range of the stop.

According to an embodiment, the heating device comprises a radiant heater for irradiating the stop with electromagnetic radiation, such as with infrared radiation.

For example, the electromagnetic radiation can be incident on a front side of the stop. The front side can be configured to absorb the electromagnetic radiation, for example infrared radiation. Alternatively, the electromagnetic radiation can also be incident on a back side of the stop which faces the other way to the front side.

According to a further embodiment, the heating device comprises a heating structure attached to the stop.

For example, the heating structure is an electrical resistor. Thus, the heating structure can be suitable for electrical resistance heating of the stop. The heating device may comprise the radiant heater only, the heating structure only or else the radiant heater and the heating structure. For example, the heating structure may be worked directly into the stop. The heating structure can be insulated from the remainder of the stop by way of a suitable insulator.

According to a further embodiment, the heating structure is supplied with power via holders of the stop.

If the stop is an obscuration stop, the latter can comprise a plurality of wire-shaped or blade-shaped holders which extend through the beam path and which are as narrow as possible so as to shade the beam path as little as possible. The heating structure can be energized via these holders. As a result, it is possible to make do without an additional electrical connection for the heating structure.

According to a further embodiment, the heating device is configured to introduce different amounts of heat into different regions of the stop.

For example, the heating structure is assigned to only one of the regions. For example, this makes it possible to heat the region to which the heating structure is assigned more strongly than another region without a heating structure. However, the other region may be heated by way of the radiant heater, for example. The deformation of the stop can be controlled in a targeted manner by way of the unequal heating of the different regions. Thus, the stop can be manipulated as desired.

The optical system also comprises a temperature sensor, a photo element and/or an infrared camera, with an open-loop and closed-loop control device of the optical system being configured to determine a local stop temperature distribution of the stop on the basis of measurement signals from the temperature sensor, the photo element and/or the infrared camera and/or on the basis of information relating to a temperature distribution of further optical elements arranged at a comparable position to the stop in the beam path, and to control the heating device in such a way that a target stop temperature distribution of the stop is obtainable.

The temperature sensor and/or the photo element can be attached directly to the stop. Any desired number of temperature sensors or photo elements may be provided. For example, the infrared camera is arranged so that the latter can sense the front side of the stop, for example, in order for example to determine the local stop temperature distribution of the stop there. In the present case, the "target stop temperature distribution" is for example the stop temperature distribution at which the design geometry is assumed.

According to an embodiment, the measurement signals from the temperature sensor and/or the photo element are transmittable via holders of the stop, and/or the measurement signals from the temperature sensor and/or the photo element are transmittable wirelessly.

By way of transmitting the measurement signals via the holders already mentioned above, it is possible to make do without additional wiring or cabling for the temperature sensor and/or the photo element. This also applies to the wireless transmission.

According to an embodiment, the stop comprises a light-absorbing coating.

For example, the light-absorbing coating can be a matt-black lacquer or the like. The stop may also comprise targeted surface roughness or surface structuring. For example, the coating is configured to absorb electromagnetic radiation, such as infrared radiation, in order to introduce heat into the stop.

Further, a projection exposure apparatus having such an optical system is proposed.

As mentioned previously, the optical system can be a projection optical unit of the projection exposure apparatus. The projection exposure apparatus can be an EUV lithography apparatus. EUV stands for "extreme ultraviolet" and refers to a wavelength of the operating light of between 0.1 nm and 30 nm. The projection exposure apparatus can also be a DUV lithography apparatus. DUV stands for "deep ultraviolet" and refers to a wavelength of the operating light of between 30 nm and 250 nm.

In an aspect, a method for operating such an optical system for a projection exposure apparatus is also proposed. The method comprises the steps: a) providing a stop, in particular an obscuration stop, a stop for the numerical aperture or an extraneous light stop, at least portions of which are arranged in a beam path of the optical system such that at least portions of the beam path are shaded by the stop, b) introducing heat into the stop with the aid of a heating device, and c) deforming the stop from an initial geometry into a design geometry with the aid of the heat. In so doing, in step b), a local stop temperature distribution of the stop is determined on the basis of measurement signals from a temperature sensor, a photo element and/or an infrared camera and/or on the basis of information relating to a temperature distribution of further optical elements arranged at a comparable position to the stop in the beam path, and the heating device is controlled in such a way that a target stop temperature distribution of the stop is obtained.

For example, heat is also introduced into the stop due to the fact that at least portions of the latter are arranged in the beam path. Then, the illumination radiation or the operating light is incident on the stop and heats at least portions of the latter. Then, the heating device is used to still introduce additional heat into the stop. The deformation of the stop in step c) is implemented by virtue of the stop expanding due to heat and deforming as a result. The provision of the stop may comprise an arrangement of the stop in the beam path.

In step b), according to an embodiment, different amounts of heat are introduced into different regions of the stop.

This gives rise to the option of heating the stop in locally variable fashion. As a result, the stop can be manipulated as desired. It is possible to provide any desired number of different regions or regions differing from one another. At least portions of the regions may intersect.

In step b), according to an embodiment, a predetermined heating power ratio of the different regions is set.

This enables targeted and reproducible heating of the different regions. In the present case, the "heating power ratio" should be understood to mean a ratio of different heating powers used to heat the regions differing from one another.

In step b), a local stop temperature distribution of the stop is determined on the basis of measurement signals from a temperature sensor, a photo element and/or an infrared camera and/or on the basis of information relating to a temperature distribution of further optical elements arranged at a comparable position to the stop in the beam path, and the heating device is controlled in such a way that a target stop temperature distribution of the stop is obtained.

As a result, the measurement signals and/or the information can be used to heat the stop in such a way that the latter adopts its design geometry in step c). The stop has assumed its design geometry or design shape once the target stop temperature distribution has been reached.

In step b), according to an embodiment, the introduction of the heat is used to implement an open-loop and/or closed-loop control which, even in the case of varying absorption of illumination radiation during the operation of the optical system, keeps a stop temperature of the stop in a temperature corridor of 10 K, such as of 5 K, for example of 2 K.

In the present case, a "temperature corridor" should be understood to mean a tolerance range or a tolerance field, in which the stop temperature of the stop is kept.

In step b), according to an embodiment, the stop temperature is incorporated as a structure size manipulator in an optimization method of the optical system on the basis of predetermined sensitivities and is adapted time-dependently for the purpose of reducing the deviation of a currently manufactured structure size from a target value.

Thus, it is possible by way of changing the stop temperature to influence structure sizes implemented on a wafer to be exposed in a targeted manner.

"A(n)" should not necessarily be understood as a restriction to exactly one element in the present case. Rather, a plurality of elements, such as two, three or more, may also be provided. Nor should any other numeral used here be understood to the effect that there is a restriction to exactly the stated number of elements. Rather, unless indicated otherwise, numerical deviations upward and downward are possible.

The embodiments and features described for the optical system apply correspondingly to the proposed projection exposure apparatus and to the proposed method, and vice versa.

Further possible implementations of the disclosure also encompass not explicitly mentioned combinations of features or embodiments that are described above or hereinafter with respect to the exemplary embodiments. In this case, a person skilled in the art will also add individual aspects as improvements or supplementations to the respective basic form of the disclosure.

Further configurations and aspects of the disclosure are the subject of the dependent claims and also of the exemplary embodiments of the disclosure that are described hereinafter. The disclosure is explained in greater detail hereinafter on the basis of embodiments with reference to the accompanying figures.

DETAILED DESCRIPTION

Unless indicated otherwise, elements that are identical or functionally identical have been provided with the same reference signs in the figures. Furthermore, it should be noted that the illustrations in the figures are not necessarily true to scale.

Figure 1:
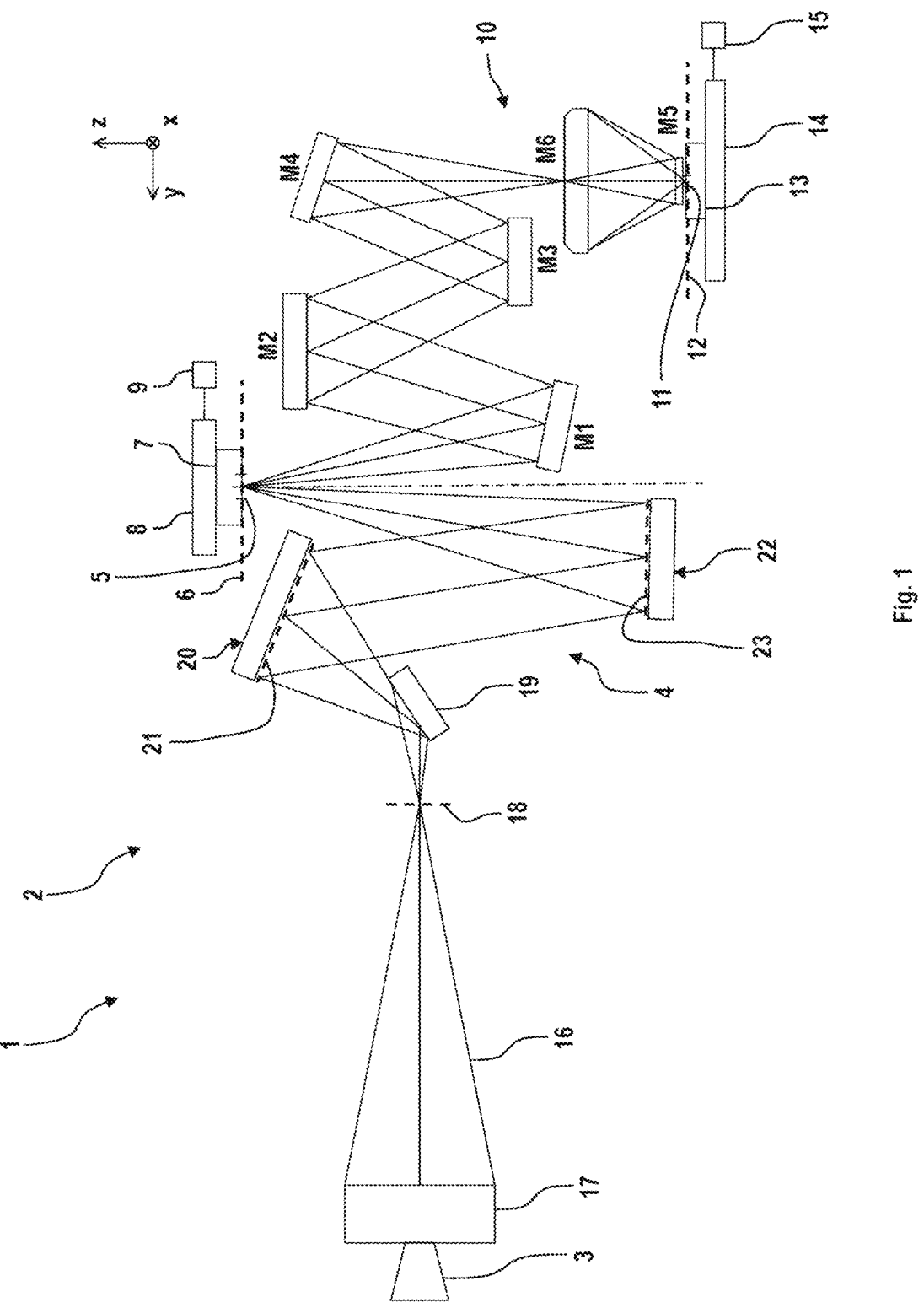
FIG. 1 shows a schematic meridional section of a projection exposure apparatus for EUV projection lithography.

FIG. 1 shows one embodiment of a projection exposure apparatus 1 (lithography apparatus), such as an EUV lithography apparatus. One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs along the y-direction y. The z-direction z runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example in the y-direction. The displacement firstly of the reticle 7 by way of the reticle displacement drive 9 and secondly of the wafer 13 by way of the wafer displacement drive 15 can be implemented so as to be mutually synchronized.

The light source 3 is an EUV radiation source. The light source 3 emits for example EUV radiation 16, which is also referred to below as used radiation, illumination radiation or illumination light. For example, the used radiation 16 has a wavelength in the range between 5 nm and 30 nm. The radiation source 3 can be a plasma source, for example an LPP (laser produced plasma) source or a GDPP (gas discharge produced plasma) source. It can also be a synchrotron-based radiation source. The light source 3 can be a free electron laser (FEL).

The illumination radiation 16 emanating from the light source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 450, or with normal incidence (NI), that is to say at angles of incidence of less than 45°. The collector 17 can be structured and/or coated, firstly to optimize its reflectivity for the used radiation and secondly to suppress extraneous light.

The illumination radiation 16 propagates through an intermediate focus in an intermediate focal plane 18 downstream of the collector 17. The intermediate focal plane 18 can represent a separation between a radiation source module, comprising the light source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. In an alternative or in addition, the deflection mirror 19 may be designed as a spectral filter that separates a used light wavelength of the illumination radiation 16 from extraneous light at a different wavelength. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which can also be referred to as field facets. Only some of these first facets 21 are shown in FIG. 1 by way of example.

The first facets 21 can be embodied as macroscopic facets, such as rectangular facets or as facets with an arcuate or part-circular edge contour. The first facets 21 can be in the form of plane facets or alternatively in the form of convexly or concavely curved facets.

As is known for example from DE 10 2008 009 600 A1, the first facets 21 themselves can also each be composed of a multiplicity of individual mirrors, such as a multiplicity of micromirrors. For example, the first facet mirror 20 can be in the form of a microelectromechanical system (MEMS system). For details, reference is made to DE 10 2008 009 600 A1.

Between the collector 17 and the deflection mirror 19, the illumination radiation 16 propagates horizontally, i.e. in the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 BI and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or else hexagonal periphery, or may alternatively be facets composed of micromirrors. In this regard, reference is likewise made to DE 10 2008 009 600 A1.

The second facets 23 can have plane or, alternatively, convexly or concavely curved reflection surfaces.

The illumination optical unit 4 consequently forms a doubly faceted system. This fundamental principle is also referred to as a fly's eye condenser (fly's eye integrator).

It may be desirable to arrange the second facet mirror 22 not exactly within a plane that is optically conjugate to a pupil plane of the projection optical unit 10. For example, the second facet mirror 22 can be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or indeed the last mirror for the illumination radiation 16 in the beam path upstream of the object field 5.

In a further embodiment (not illustrated) of the illumination optical unit 4, a transfer optical unit may be arranged in the beam path between the second facet mirror 22 and the object field 5, and contributes for example to the imaging of the first facets 21 into the object field 5. The transfer optical unit may have exactly one mirror or, alternatively, two or more mirrors, which are arranged in succession in the beam path of the illumination optical unit 4. The transmission optical unit can comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20, and the second facet mirror 22.

In a further embodiment of the illumination optical unit 4, there is also no need for the deflection mirror 19, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is routinely only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are likewise possible. The projection optical unit 10 is a doubly obscured optical unit. The penultimate mirror M5 and the last mirror M6 each have a through opening for the illumination radiation 16. The projection optical unit 10 has an image-side numerical aperture that is greater than 0.5 and can also be greater than 0.6 and can be for example 0.7 or 0.75.

Reflection surfaces of the mirrors Mi can be in the form of free-form surfaces without an axis of rotational symmetry. Alternatively, the reflection surfaces of the mirrors Mi can be designed as aspherical surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, such as with alternating layers of molybdenum and silicon.

The projection optical unit 10 has a large object-image offset in the y-direction y between a y-coordinate of a center of the object field 5 and a y-coordinate of the center of the image field 11. This object-image offset in the y-direction y can be of approximately the same magnitude as a z-distance between the object plane 6 and the image plane 12.

The projection optical unit 10 can have an anamorphic embodiment. It has for example different imaging scales βx, βy in the x- and y-directions x, y. The two imaging scales βx, βy of the projection optical unit 10 can be (βx, βy)=(+/−0.25, +/−0.125). A positive imaging scale β means imaging without image inversion. A negative sign for the imaging scale β means imaging with image inversion.

The projection optical unit 10 consequently leads to a reduction in size with a ratio of 4:1 in the x-direction x, that is to say in a direction perpendicular to the scanning direction.

The projection optical unit 10 leads to a reduction in size of 8:1 in the y-direction y, that is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 can be the same or can differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This can in p result in illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of illuminating the object field 5. The illumination of the object field 5 is for example as homogeneous as possible. It can have a uniformity error of less than 2%. Field uniformity can be achieved by overlaying different illumination channels.

The illumination of the entrance pupil of the projection optical unit 10 can be defined geometrically by an arrangement of the second facets 23. The intensity distribution in the entrance pupil of the projection optical unit 10 can be set by selecting the illumination channels, for example the subset of the second facets 23, which guide light. This intensity distribution is also referred to as illumination setting or illumination pupil filling.

A likewise preferred pupil uniformity in the region of portions of an illumination pupil of the illumination optical unit 4 that are illuminated in a defined manner can be achieved by a redistribution of the illumination channels.

Further aspects and details of the illumination of the object field 5 and for example of the entrance pupil of the projection optical unit 10 are described below.

The projection optical unit 10 may have a homocentric entrance pupil for example. The latter can be accessible. It can also be inaccessible.

The entrance pupil of the projection optical unit 10 regularly cannot be exactly illuminated with the second facet mirror 22. When imaging the projection optical unit 10, which images the center of the second facet mirror 22 telecentrically onto the wafer 13, the aperture rays often do not intersect at a single point. However, it is possible to find an area in which the spacing of the aperture rays that is determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, such as an optical component part of the transfer optical unit, should be provided between the second facet mirror 22 and the reticle 7. With the aid of this optical element, the different poses of the tangential entrance pupil and the sagittal entrance pupil can be taken into account.

In the arrangement of the component parts of the illumination optical unit 4 shown in FIG. 1, the second facet mirror 22 is arranged in an area conjugate to the entrance pupil of the projection optical unit 10. The first facet mirror 20 is arranged tilted in relation to the object plane 6. The first facet mirror 20 is arranged tilted in relation to an arrangement plane defined by the deflection mirror 19. The first facet mirror 20 is arranged tilted in relation to an arrangement plane defined by the second facet mirror 22.

Figure 2:
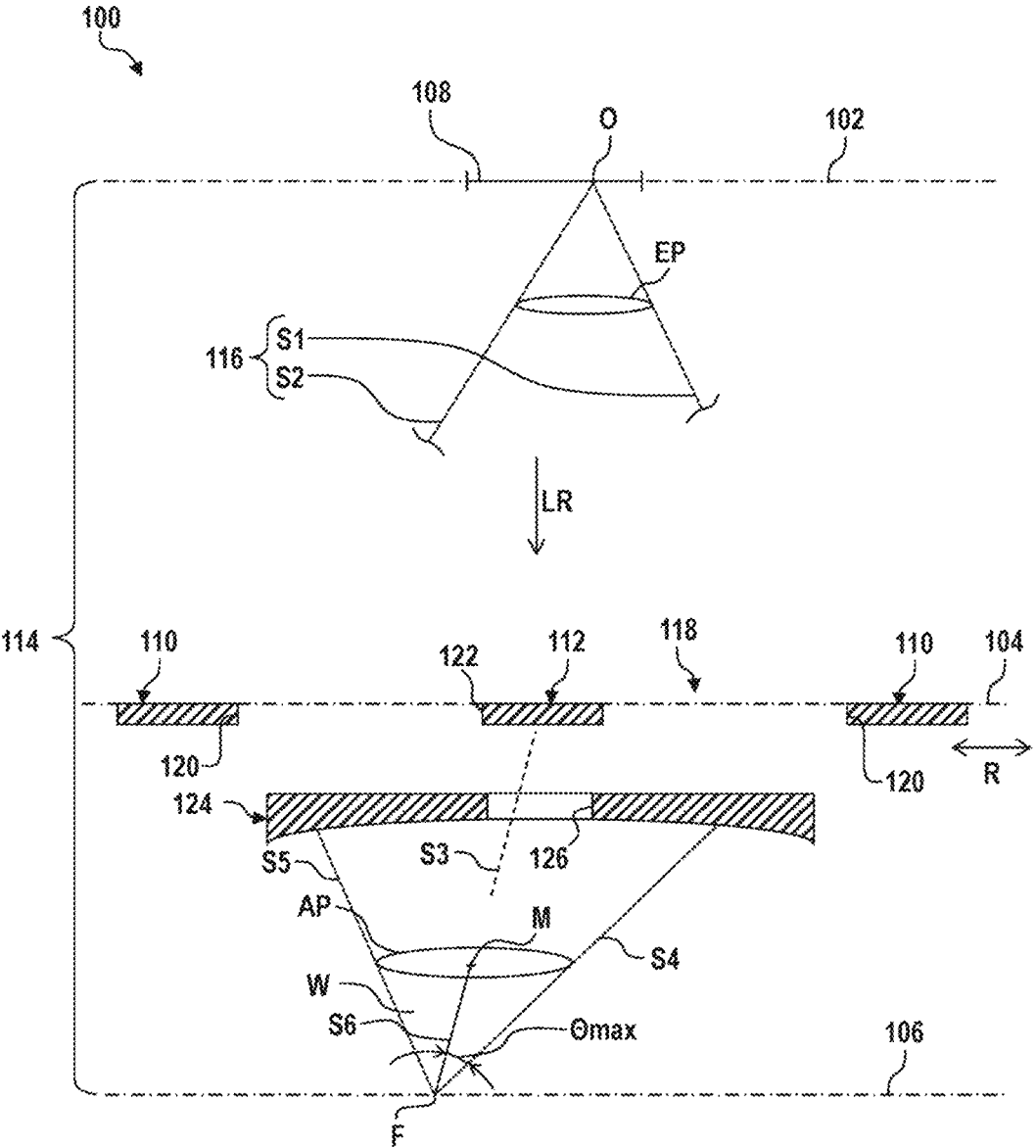
FIG. 2 shows a schematic view of an embodiment of an optical system for the projection exposure apparatus according to FIG. 1.

FIG. 2 shows a schematic view of an optical system 100. The optical system 100 is part of a projection exposure apparatus 1 as explained above. For example, the optical system 100 can be a projection optical unit 10 as explained above or a part of such a projection optical unit 10.

For example, the optical system 100 comprises an object plane 102, a pupil plane 104 and a field plane 106. Image or intermediate image planes may also be provided. An object field or used field 108 having a multiplicity of object points O, of which however only one is provided with a reference sign in FIG. 2, is provided in the object plane 102. With the aid of the pupil plane 104, the object points O are imaged onto field points F in the field plane 106. However, the following text makes reference to only one object point O and one field point F.

An object (not shown) is positioned in the object plane 102. The object can be the reticle 7. The used field 108 is provided at or on the object or at or on the reticle 7. For example, the wafer 13 to be exposed is arranged in the field plane 106. In principle, the field plane 106 can also be an image plane or intermediate image plane.

Rather than the object plane 102, a field plane can also be provided, with images therein being imaged onto the field plane 106. The pupil plane 104 can be provided between the object plane 102 and the field plane 106. The pupil plane 104 is thus arranged neither on the object side nor on the image side.

In principle, there can be any number of planes 102, 104, 106. The imaging optical system 100 forms a chain comprising the object plane 102, the pupil plane 104, such as the first pupil plane, optionally a first intermediate image plane or field plane, optionally a second pupil plane, optionally an (n-1)-th intermediate image plane or field plane, optionally a n-th pupil plane and the image plane or field plane 106. In this case, "optionally" means that these aforementioned planes can also be missing, albeit only in pairwise fashion. Specifically, for example, an intermediate image plane and the subsequent pupil plane. Thus, n is no smaller than 1. In this case, the term "plane" should not be taken literally. Rather, the planes 102, 104, 106 are areas.

The image plane or field plane 106 is always corrected well. That is to say, there are few aberrations linked with the imaging of the object point O on the object plane 102 onto the field point F in the image plane or field plane 106. The intermediate image planes or intermediate field planes can also be corrected well, but this is usually not the case. If the intention were to capture an image there, the latter would usually be subject to significant aberrations and have an accordingly poorer quality. In this case, the quality can be so poor that the image is unrecognizable because the best image positions of different field points can be spaced apart significantly in the light direction. Furthermore, there can also be image aberrations such as spherical aberration, astigmatism or coma which lead to worse point spread function.

Extraneous light stops can be arranged in those (partial) regions of intermediate field planes in which there is a sufficiently accurate assignment of object locations to points. This is ideal in the course without self-intersections and the like. Likewise, a pupil plane 104 as mentioned above can be well corrected. However, this is not mandatory. In this context, "well corrected" means that light emitted at the same angle at different locations from the object is incident at the same location in the pupil plane 104. If such a well-corrected pupil plane 104 is present, it can be suitable for the placement of aperture or obscuration stops.

One or more stops are arranged in the pupil plane 104. According to the exemplary embodiment, a stop for the numerical aperture 110 (NA stop) and an obscuration stop 112 are provided. Together with the planes 102, 104, 106, the stops 110, 112 define a beam path 114, along which operating light 116 travels through the optical system 100. The operating light 116 can be the illumination radiation 16. The stop for the numerical aperture 110 may also be referred to as numerical aperture stop.

In place of or in addition to the stops 110, 112, a stray light and/or extraneous light stop (not shown) may also be provided in the pupil plane 104 or at different positions, especially in intermediate image planes (not depicted). A light direction LR of the operating light 116 can be oriented from the object plane 102 in the direction of the pupil plane 104.

The NA stop 110 comprises an aperture 118 that is defined by a light-determining edge 120. The light-determining edge 120 can be enclosing. The aperture 118 can have any desired geometry. The NA stop 110 can be made of multiple parts, with the result that the geometry of the aperture 118 is adjustable.

The obscuration stop 112 also comprises a light-determining edge 122. The light-determining edge 122 is enclosing. The obscuration stop 112 can have any desired geometry. For example, the obscuration stop 112 can be oval. The light direction LR can be oriented perpendicular or at an angle to the stops 110, 112.

In this case, the operating light 116 comprises light rays S1, S2 by way of example, the light rays describing the imaging of the object point O onto the field plane 106. The illustration is purely schematic, and so a multiplicity of optical elements, for example mirrors, lens elements, optical gratings or the like, can be arranged between the object plane 102 and the pupil plane 104 and between the pupil plane 104 and the field plane 106. The optical elements can comprise the mirrors M1 to M6.

By way of example, FIG. 2 shows a mirror 124 between the pupil plane 104 and the field plane 106, and detailed reference will be made to the mirror hereinbelow. The mirror 124 can correspond to the mirror M6.

The NA stop 110 has the task of trimming the operating light 116 in a radial direction R with reference to the beam path 114 from the outside to the inside and thereby delimits a maximum half image-side opening angle $\theta_{max}$ of a light-filled angular space W assigned to the field point F.

The opening angle $\theta_{max}$ in turn specifies the numerical aperture of the optical system 100. In the case of a large numerical aperture, the opening angle $\theta_{max}$ is very large and the angular space W accordingly has a flat conical geometry. In the case of a small numerical aperture, the opening angle $\theta_{max}$ is very small and the angular space W accordingly has an acute conical geometry.

The field point F is assigned an exit pupil AP. The exit pupil AP is an image-side image representation of the NA stop 110 and the obscuration stop 112. FIG. 2 also shows an entrance pupil EP for the object point O. The entrance pupil EP is an object-side image representation of the NA stop 110 and the obscuration stop 112. Each field point F is assigned an exit pupil AP. Each object point O is assigned an entrance pupil EP.

The obscuration stop 112 has the task of covering an obscuration 126 in the beam path 114. To this end, it cuts out—in relation to the beam path 114—a radially inner part of the operating light 116 as viewed in the direction R. For example, the obscuration 126 can be a perforation in the mirror 124, with the result that a light ray S3 assigned to the field point F per se does not reach the latter, i.e. a shadow arises.

The obscuration stop 112 is chosen to be so large and arranged such that the shadow in the exit pupil AP created by the obscuration 126 is located behind the shadow of the obscuration stop 112 for each field point F. In other words, the obscuration 126 thus has a field-constant behavior. The shadow of the obscuration stop 112 completely covers the shadow of the obscuration 126.

Above the field point F, the exit pupil AP spans the light-filled angular space W. The angular space W is delimited by marginal (light) rays S4, S5. Each of these are incident on the field point F at half the image-side opening angle $\theta_{max}$. The opening angle $\theta_{max}$ is measured between a respective light ray S4, S5 and a central (light) ray S6 at the field point F. The light ray S6 intersects a center M of the exit pupil AP. The light ray S6 can also be located in the obscuration 126, that is to say be dark at all times. Nevertheless, it serves in the present case as an (imaginary) reference.

Figure 3:
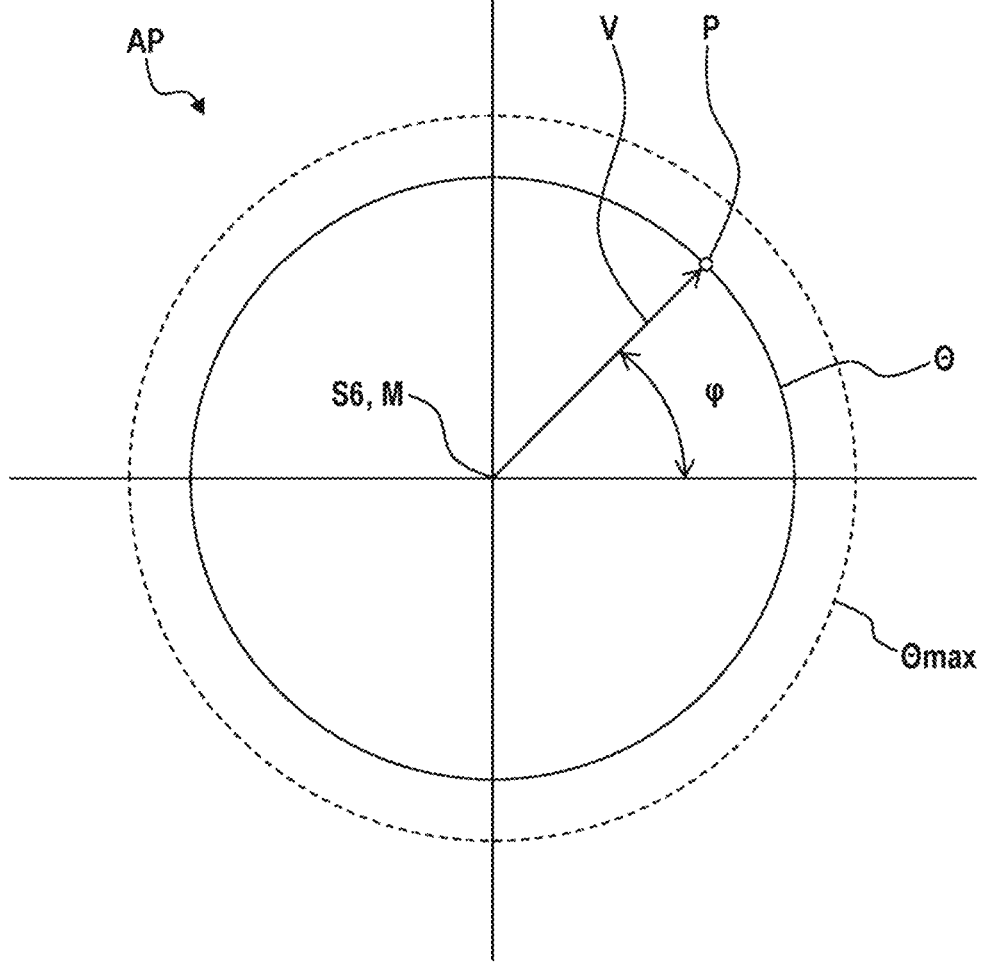
FIG. 3 shows a schematic view of an exit pupil for the optical system according to FIG. 2.

As shown in FIG. 3, each point P in the exit pupil AP can be described with the aid of a direction vector V. The direction vector V has an opening angle $\theta$ with respect to the light ray S6. The direction vector V also has a circumferential angle $\varphi$ in the circumferential direction around the center M. In principle, it holds true that each light ray in the exit pupil AP—described by the angles $\theta$, $\varphi$—is assigned a location in the pupil plane 104. In other words, each field point F of the field plane 106 thus sees all the light points in the pupil plane 104. This is also true in the reverse: The light in an angular space above the pupil plane 104 is assigned a location in the field plane 106. The exit pupil AP is thus field-constant. The light incident on the field plane 106 is constant for each field point F.

Tight shape and position tolerances apply both to the NA stop 110 and to the obscuration stop 112. The stops 110, 112 are frequently designed as thin plates. For example, metallic sheets can be used. In the case of the NA stop 110, the sheet metal then includes the aperture 118 defined by the light-determining edge 120. In the case of the obscuration stop 112, the sheet metal has an outer boundary in the form of the light-determining edge 122. Hereinbelow, the NA stop 110 and the obscuration stop 112 are also referred to generally as "stops".

The size of the light-transmissive region is an important aspect for the imaging effect. This size is defined with the aid of the stops 110, 112. Even small deviations can lead to noticeable changes in contrast as a result of diffracted light being inadvertently blocked or additionally transmitted. In EUV systems, this effect is additionally exacerbated by locally shining spots of light ("starry sky") on account of a missing option for mixing light.

This is because the specifics of current EUV systems include the limited mixing capability of the illumination optical unit 4 in the angular space, with the result that there typically are individual bright illumination spots in the otherwise dark region in the pupil plane 104. Occasionally, such an intensity distribution is compared figuratively to a starry sky. Compared to a smooth, uniform light distribution in the angular space known from DUV, such a light distribution has the property that already a small change in the transmitted angular range leaves behind a noticeable influence on the intensity because the energy is more concentrated.

Figure 4:
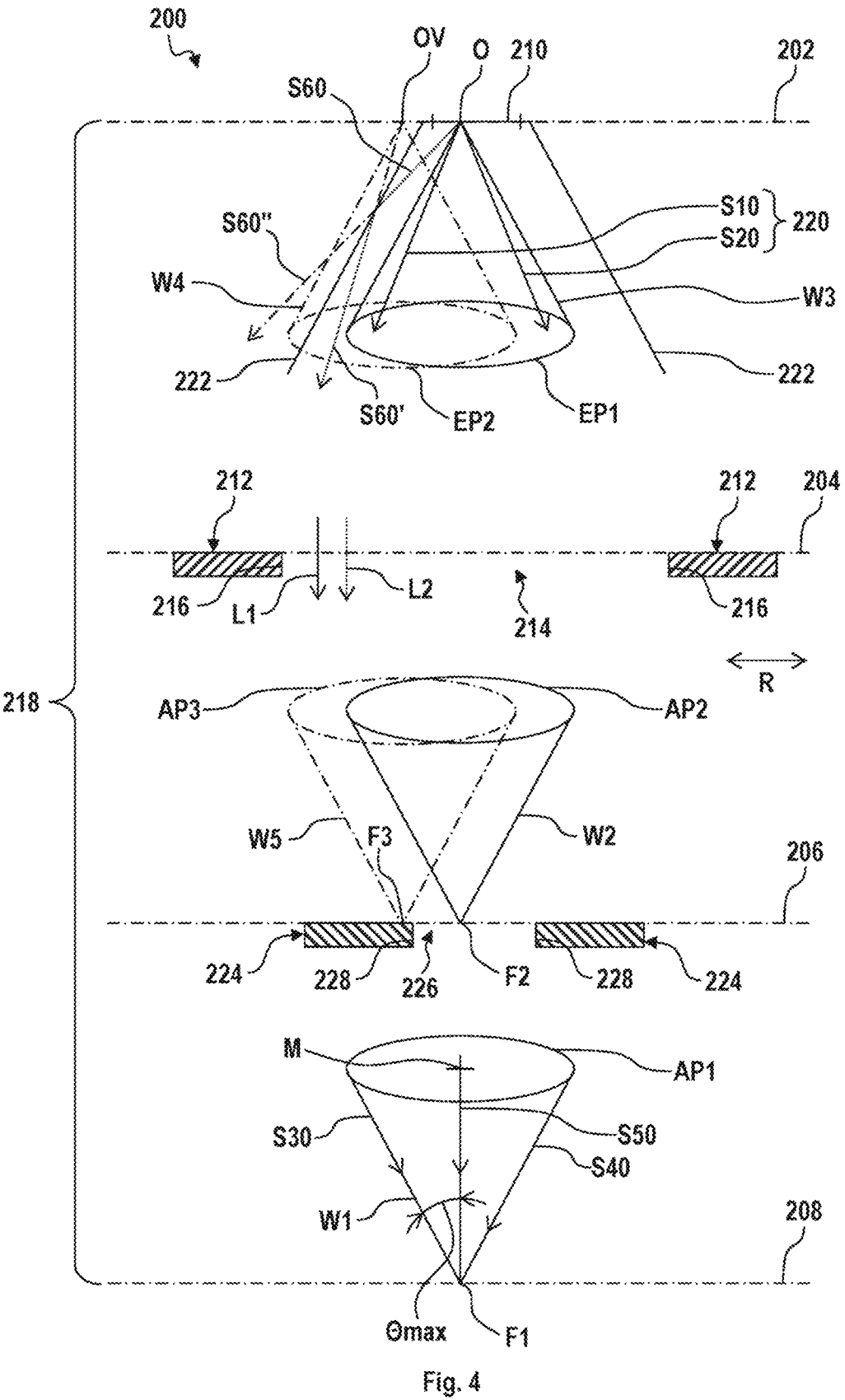
FIG. 4 shows a schematic view of a further embodiment of an optical system for the projection exposure apparatus according to FIG. 1.

FIG. 4 shows a schematic view of a further embodiment of an optical system 200. The optical system 200 is part of a projection exposure apparatus 1 as explained above. For example, the optical system 200 can be a projection optical unit 10 as explained above or a part of such a projection optical unit 10.

The optical system 200 basically differs from the optical system 100 in that the optical system 200 has no obscuration stop 112. However, the optical system 200 can also comprise an obscuration stop 112 in principle.

The optical system 200 comprises an object plane 202, a pupil plane 204, an image or intermediate image plane 206 and a field plane 208. A further pupil plane 204, which is however not shown in FIG. 4, can be provided between the intermediate image plane 206 and the field plane 208.

An object field or used field 210 having a multiplicity of object points O, of which however only one is provided with a reference sign in FIG. 4, is provided in the object plane 202. The object points O are imaged onto field points F1 in the field plane 208 and onto field points F2 in the intermediate image plane 206 with the aid of the pupil plane 204 or with the aid of the pupil planes 204.

An object (not shown) is positioned in the object plane 202. The object can be the reticle 7. The used field 210 is provided at or on the object or at or on the reticle 7. For example, the wafer 13 to be exposed is arranged in the field plane 208. In principle, the field plane 208 can also be an image plane or intermediate image plane.

Instead of the object plane 202, a field plane can also be provided, with images therein being imaged onto the field plane 208 and onto the intermediate image plane 206. The pupil plane 204 can be provided between the object plane 202 and the field plane 208.

The pupil plane 204 is thus arranged neither on the object side nor on the image side.

One or more stops are arranged in the pupil plane 204. According to the exemplary embodiment, a stop for the numerical aperture 212 (NA stop) is provided. Further, an obscuration stop (not shown) can also be provided. The stop for the numerical aperture 212 may also be referred to as numerical aperture stop.

The NA stop 212 comprises an aperture 214 that is defined by a light-determining edge 216. The light-determining edge 216 can be enclosing. The aperture 214 can have any desired geometry. The NA stop 212 can be made of multiple parts, with the result that the geometry of the aperture 214 is adjustable.

Together with the planes 202, 204, 206, 208, the NA stop 212 defines a beam path 218, along which operating light 220 travels through the optical system 200. The operating light 220 can be the illumination radiation 16. Instead of or in addition to the NA stop 212, a stray light and/or extraneous light stop (not shown) might be provided in the pupil plane 204 or at different positions, specifically in the intermediate image plane 206, as will be explained below with reference to the intermediate image plane 206.

In this case, the operating light 220 comprises light rays S10, S20 by way of example, the light rays describing the imaging of the object points O onto the intermediate image plane 206 and onto the field plane 208. The illustration is purely schematic, and so a multiplicity of optical elements, for example mirrors, lens elements, optical gratings and/or the like, can be arranged between the object plane 202 and the pupil plane 204, between the pupil plane 204 and the intermediate image plane 206 and also between the intermediate image plane 206 and the field plane 208. For example, the optical elements can comprise the mirrors M1 to M6.

The NA stop 212 has the task of trimming the operating light 220 in a radial direction R with reference to the beam path 218 from the outside to the inside and thereby delimits a maximum half image-side opening angle $\theta_{max}$ of a light-filled angular space W1 assigned to the field point F1. As already explained above in the context of the NA stop 110, the opening angle $\theta_{max}$ once again specifies the numerical aperture of the optical system 200.

The field point F1 is assigned an exit pupil AP1. The exit pupil AP1 is an image-side image representation of the NA stop 212. FIG. 4 also shows an entrance pupil EP1 for the object point O. The entrance pupil EP1 is an object-side image representation of the NA stop 212. Each field point F1 is assigned an exit pupil AP1. Each object point O is assigned an entrance pupil EP1.

Above the field point F1, the exit pupil AP1 spans the light-filled angular space W1. The angular space W1 is delimited by marginal (light) rays S30, S40. Each of these are incident on the field point F1 at half the image-side maximum opening angle $\theta_{max}$. The maximum opening angle $\theta_{max}$ is measured between the respective light ray S30, S40 and a central (light) ray S50 at the field point F1. The light ray S50 intersects a center M of the exit pupil AP1.

The field point F2 is assigned an intermediate image pupil AP2, which defines an angular space W2. The entrance pupil EP1 is likewise assigned such an angular space W3.

Figure 5:
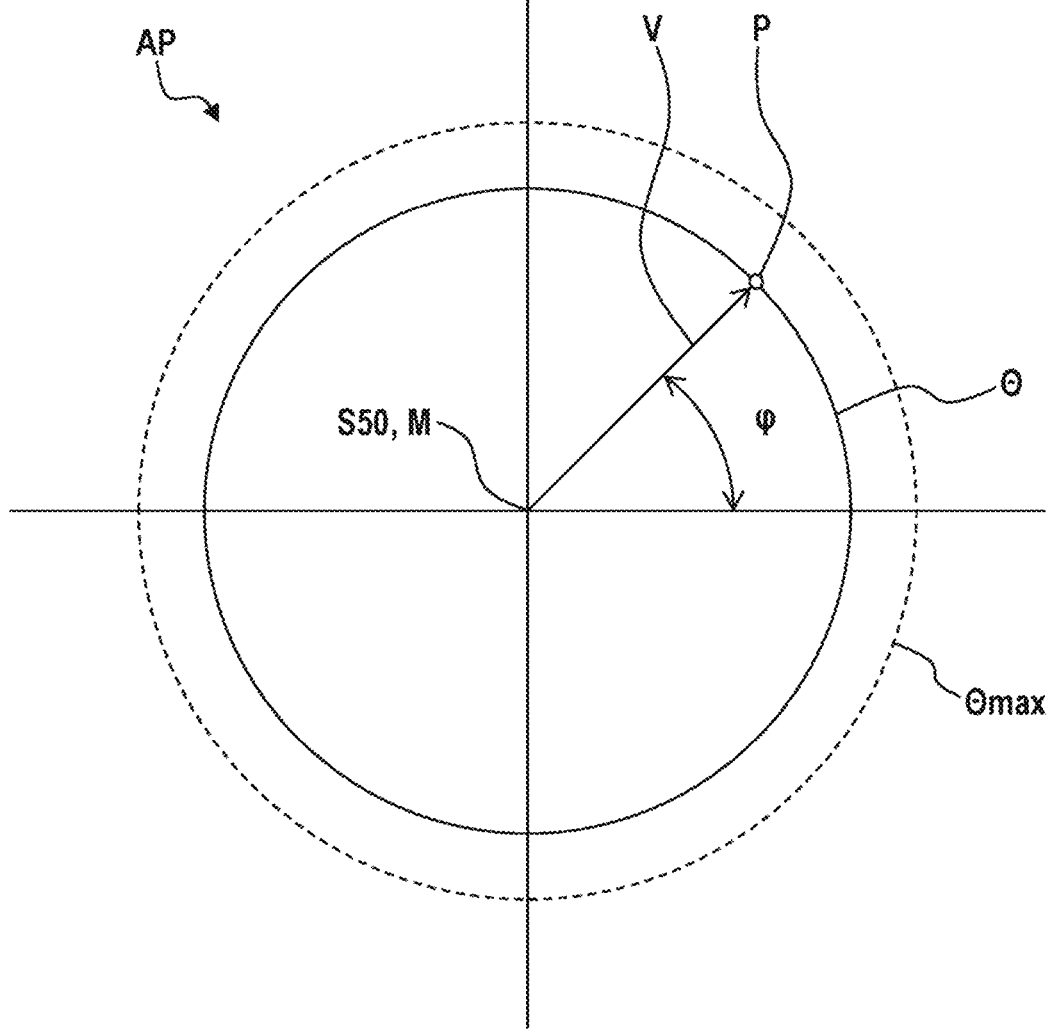
FIG. 5 shows a schematic view of an exit pupil for the optical system according to FIG. 4.

As shown in FIG. 5 and as already explained in relation to FIG. 3, each point P of the exit pupil AP1 can be described with the aid of a direction vector V. The direction vector V has an opening angle $\theta$ with respect to the light ray S50. The direction vector V also has a circumferential angle <p in the circumferential direction around the center M.

As mentioned above, the entrance pupil EP1 is the object-side image representation of the NA stop 212. The entrance pupil EP1 can also be called the used aperture or be equated thereto. During the operation of the optical system 200, light at the reticle 7 positioned in the object plane 202 is also diffracted into greater angles than the used aperture.

In other words, the light is diffracted into a greater angle than the maximum opening angle $\theta_{max}$ defined by the NA stop 212. This is shown in FIG. 4 on the basis of a light ray S60. This can occur at regularly imaged structures of the reticle 7 at higher orders of diffraction and also at assist structures such as the so-called SRAFs (sub-resolution assist features).

These SRAFs are intended to redistribute light such that used structures are imaged without thinning at the ends or other errors. However, they themselves should be invisible in the image, that is to say in the field plane 208. For this reason, they are chosen to be so small that all orders of diffraction capable of being imaged are located outside the entrance pupil EP1 or outside the used aperture and are ideally blocked at the NA stop 212. In other words, light rays having a greater opening angle $\theta$ than the maximum opening angle $\theta_{max}$ determined by the NA stop 212 are blocked at the NA stop 212.

From a constructional point of view, however, the beam path 218 has a housing 222, at least in the region of the reticle 7. The housing 222 serves for maintaining the vacuum and for keeping away contamination. However, grazing incidence reflections may occur at the housing 222.

This reflection changes the beam angle for selected angle ranges such that, following the reflection, the light is located back in the entrance pupil EP1 or in the used aperture. However, the light now appears to come from a virtual object point OV outside the used field 210. The virtual object point OV is assigned a virtual entrance pupil EP2 defining an angular space W4.

In FIG. 4, the light ray S60 is given the reference sign S60' following the reflection at the housing 222. An extension of the light ray S60' in the direction of the object plane 202 leads to the virtual object point OV. An extension of the light ray S60 beyond the housing 222 is given the reference sign S60".

The NA stop 212 can now no longer intercept the extraneous light in the form of the reflected light ray S60' because the opening angle $\theta$ appears to be "correct" following the reflection at the housing 222. That means that the opening angle $\theta$ is smaller than the maximum opening angle $\theta_{max}$ defined by the NA stop 212. As a result, it is not only light L1 from the object points O of the used field 210 that passes through the NA stop 212 but also light L2 from virtual object points OV outside the used field 210. The light L2 can also be referred to as superaperture light or extraneous light.

The aim is now to prevent the extraneous light L2 from reaching the field plane 208. The extraneous light L2 contributes no useful imaging information and would only lead to a contrast-reducing background in the field plane 208. The extraneous light L2 is therefore filtered out upstream of the field plane 208. For this purpose, the object points O are imaged as field points F2 and the virtual object points OV are imaged as field points F3 in the intermediate image plane 206. The field point F3 is assigned an intermediate image pupil AP3, which defines an angular space W5.

A stop 224, such as an extraneous light stop or stray light stop, which filters the extraneous light L2 out of the beam path 218, is now arranged in the intermediate image plane 206. In other words, the virtual object points OV are imaged as field points F3 on the stop 224. Hence, the extraneous light L2 can no longer reach the field plane 208. The stop 224 comprises an aperture 226 that is defined by a light-determining edge 228. The stop 224 is also referred to hereinbelow as extraneous light stop. The optical system 100 can also have such a stop 224.

The stops 110, 112, 212, 224 of the respective optical system 100, 200, as aperture and obscuration stops, serve to shape the exit pupil AP, AP1 and, as extraneous light stops, serve to remove unwanted light from the image or from locations where it may lead to bothersome heating. The geometry of the stops 110, 112, 212, 224 has a significant influence on the imaging quality.

NA stops 110, 212 are attached in a pupil-proximate position in an optical system 100, 200 as mentioned above, and obscuration stops 112 are attached in the position in obscured optical systems 100. In this context, the design process includes a correction such that a Fourier relationship with respect to the respective field plane 106, 208 is largely valid. Locations in the image correspond to angles there, and vice versa. Thanks to this correction, all field points F, F1 see virtually the same angular space during imaging.

An illumination optical unit 4 as mentioned above usually operates with faceted mirrors or other components that bring about pupil faceting, for instance mixing rods or fly's eye condensers. The resultant discontinuous light distribution in the exit pupil AP, AP1 leads to a high sensitivity to the pupil curtailment by the respective stop 110, 112, 212 because the energy is more localized in the angular space, and it makes a difference whether, for example, an EUV "star" (illumination spot) is cut off or allowed to pass and whether the light contributes in correspondingly interfering fashion to the imaging.

Specifically, properties such as the structure size fidelity of the imaging or the positional accuracy depend on this pupil effect. As a rule, structures on the reticle 7 as a lithographic template are corrected for systematic imaging deviations in the structure size. However, this is implemented due to the significant outlay in field-constant fashion.

If such a reticle 7 is now designed thus, the optical system 100, 200 will form structures with the right size and shape at the right image location under standard conditions. However, if there is a change in the shape of the NA stop 110, 212 and/or the obscuration stop 112, there is, first of all, a change in the quantity of light. Provided this were measured, this would still be compensable by way of a dose adaptation since the stops 110, 112, 212 and also their shape variation indeed have a field-constant effect.

However, as a rule, the relationships between zeroth and higher orders of diffraction are changed in structure-dependent fashion. For example, if the NA stop 110, 212 becomes larger, then some of the first order of diffraction of a first fine structure, which is diffracted into large angles, can no longer pass the NA stop. However, the equivalent diffraction light of a second structure which is only slightly coarser no longer sees this modification or only sees it to a reduced extent.

As a consequence, the size of the first structure will for example become smaller in the image while the size of the second structure remains unchanged. Such a change in relative size can be compensated with great difficulties or not at all in the system using a conventional approach, and therefore reduces the imaging quality.

Attention is now directed back to the stop 224. The intention is that the stop 224 prevents unwanted extraneous light L2 from reaching into the image or striking components and heating the latter following absorption. As mentioned hereinabove, the extraneous light L2 may arise as a result of superaperture light being reflected at the housing 222. The light would be caught by the NA stop 212 in the absence of this reflection, but the reflection may lead to the new beam angle being in the entrance pupil EP1 or in the used aperture and creating a virtual source outside of the used field 210.

Stray light, which propagates along wrong paths and brings about no useful imaging, also arises by scattering at optical components, for example on account of their roughness or graininess in the volume material of lens elements. Thus, in order to reduce extraneous light, restrictions in the form of the stop 224 are introduced proximate to the intermediate image.

For example, if there is a change in the geometry or size of the stop 224, then there is a variation in the residual amount of extraneous light L2 reaching into the image. The extraneous light L2 typically has an inhomogenous intensity distribution in the image space, with the result that the variation will also be field-variable. Compensators can be provided for long-wavelength variations in this intensity. However, high-frequency profiles cannot be tackled, and so at least residual contributions remain. These bring about a spatially dependent variation in the structure sizes for the same mask template in the image.

The stops 110, 112, 212, 224 are usually manufactured as thin metal parts, especially as sheet metals, with a defined shape. As dimensional precision is important, these parts cost significantly more than would be expected given the input of material. If the stops 110, 112, 212, 224 now capture light L1, L2 according to the task at hand, they will absorb at least some of it and heat up as a result.

While NA stops 110, 212 and extraneous light stops 224 are usually located at the edge of the optical beam path and can consequently be thermally linked to the outside world via material with a large cross section, the situation is more difficult for an obscuration stop 112 located in the middle of the beam path 114.

Such an obscuration stop 112 can be kept in position with the aid of blade-shaped holders or wires. These holders, for example in the form of the aforementioned wires, block used light and are therefore designed to be as thin as possible. Since thermal conduction is proportional to the material cross section, the cooling for the obscuration stop 112 via this link acts weakly.

The gas cooling is also low, especially in vacuo in the case of optical systems 100, 200 in the EUV sector. According to the Stefan-Boltzmann law, radiative cooling only contributes to heat dissipation at relatively high temperatures. For example, if the assumption is made that power absorbed can be in an order of magnitude of approximately 1 W, then the obscuration stop 112 can easily heat by several 10 K in the static state.

Metallic coefficients of thermal expansion are in an order of magnitude of approximately 1E-5/K. The extension of the obscuration stop 112 is in the order of magnitude of 10 mm. Hence, shape changes in the order of magnitude of micrometers or, converted to pupil coordinates, in the order of magnitude of 0.01 m$\sigma$ to 0.1 m$\sigma$ (1 $\sigma$=full pupil) are to be expected.

On account of the discontinuous light distribution in the exit pupil AP, AP1 mentioned above, such an apparently small value can already influence the imaging noticeably and, in an exemplary case with structure widths in the order of magnitude of 10 nm, bring about a change in structure size in the order of magnitude of 5 pm. A significant contribution to the budget arises here if the assumption is made that the structure sizes and hence their tolerances reduce in perspective while the irradiation powers increase at the same time.

Figure 6:
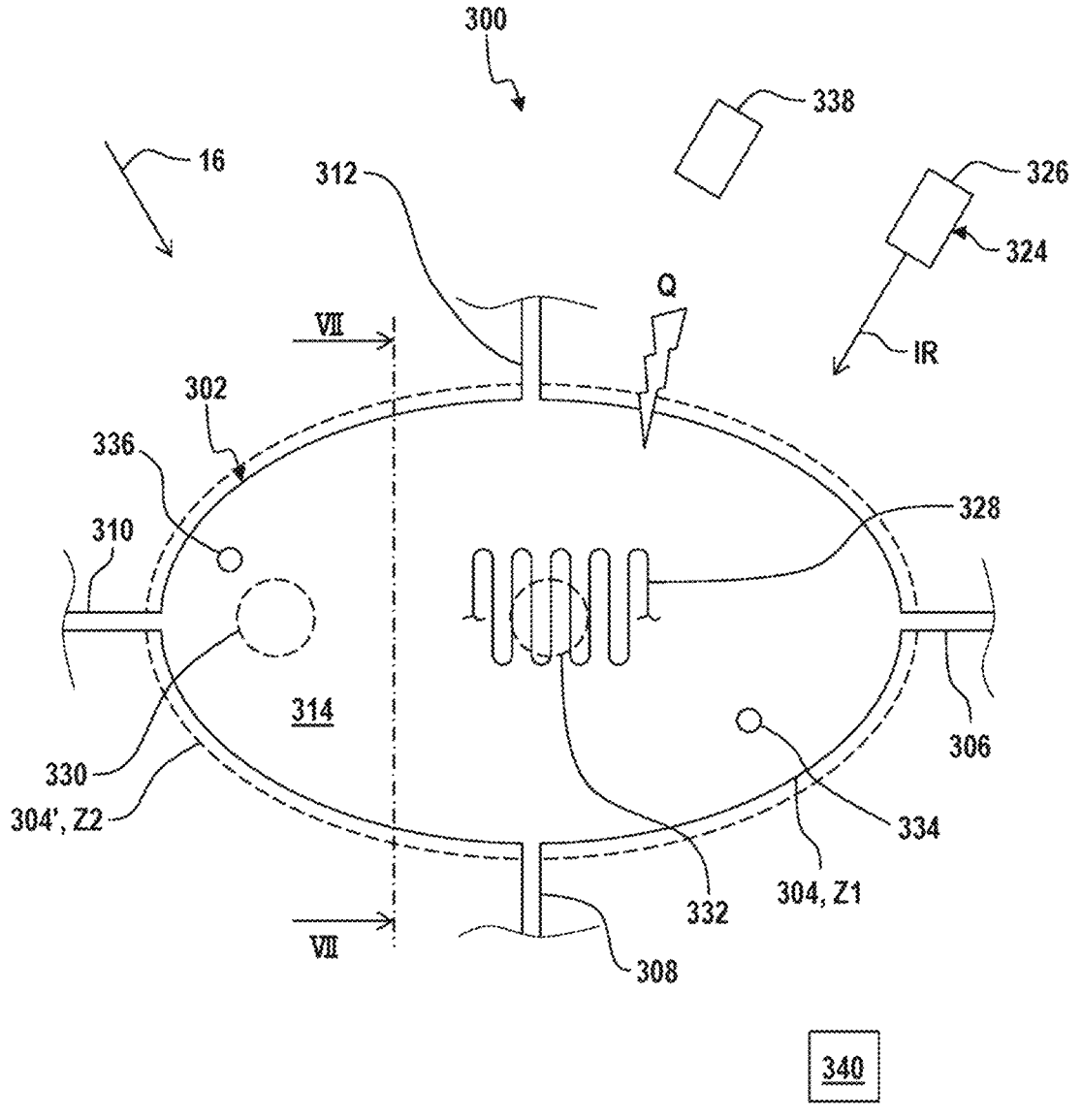
FIG. 6 shows a schematic plan view of an embodiment of a stop arrangement for the optical system according to FIG. 2 or FIG. 4.
Figure 7:
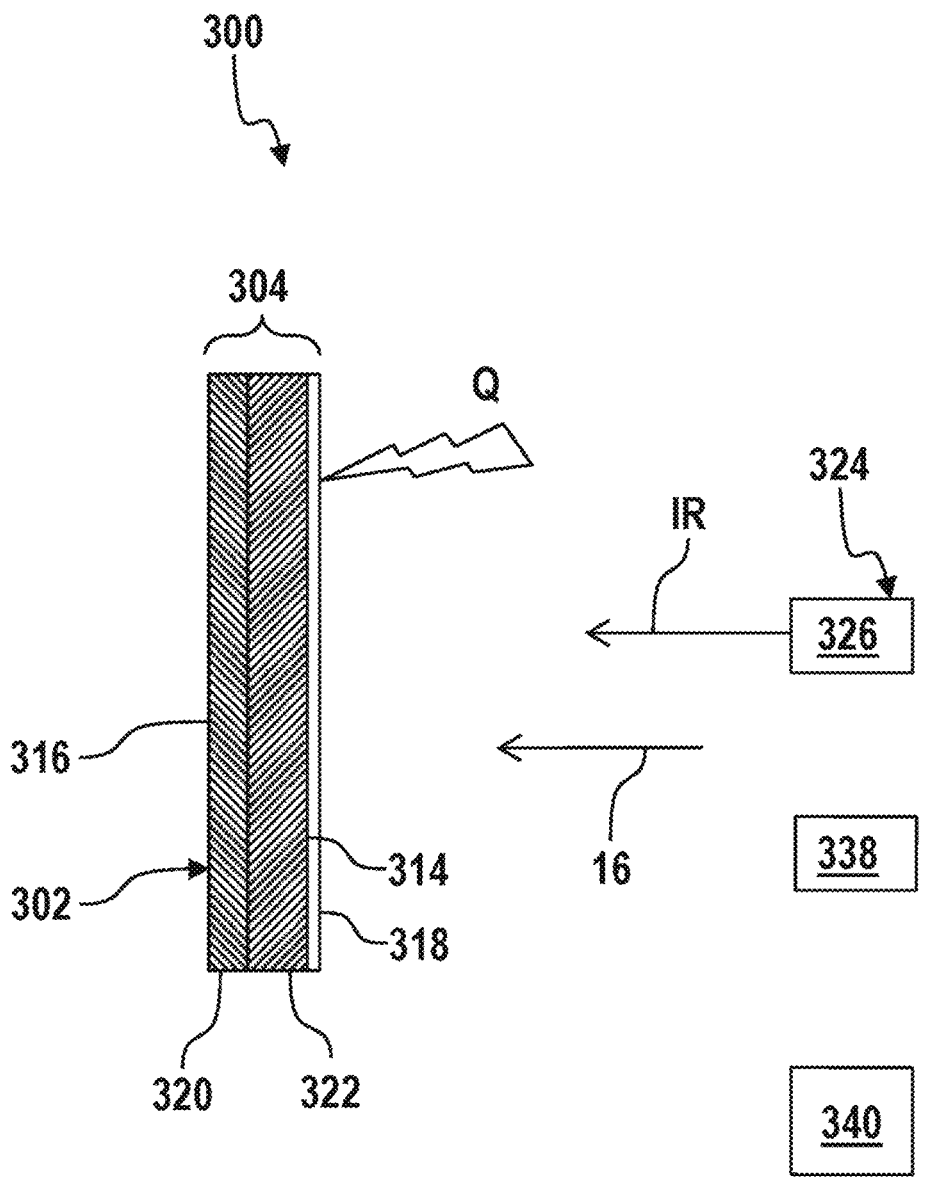
FIG. 7 shows a schematic sectional view of the stop arrangement according to the sectional line VII-VII in FIG. 6.

FIG. 6 shows a schematic plan view of an embodiment of a stop arrangement 300. FIG. 7 shows a schematic sectional view of the stop arrangement 300 according to the sectional line VII-VII in FIG. 6. In the following text, reference is made to FIGS. 6 and 7 simultaneously.

The stop arrangement 300 can be part of one of the optical systems 100, 200. The stop arrangement 300 comprises a stop 302. In the present case, the stop 302 is an obscuration stop as mentioned above. The explanations given below in relation to the stop 302 are also correspondingly applicable to the stops 110, 112, 212, 224.

The stop 302 has a light-determining edge 304. In the present case, the light-determining edge 304 has an elliptical geometry. However, the light-determining edge 304 can have any desired geometry. The light-determining edge 304 can be circumferentially closed. However, this is not mandatory.

The stop 302 comprises a plurality of holders 306, 308, 310, 312 for positioning the stop 302 in the beam path 114, 218. There can be any desired number of holders 306, 308, 310, 312. For example, four holders 306, 308, 310, 312 are provided. The holders 306, 308, 310, 312 are blade-shaped or wire-shaped such that these shade the beam path 114, 218 as little as possible.

The stop 302 comprises a front side 314 and a back side 316 facing away from the front side. For example, the illumination radiation 16 is incident on the front side 314. However, the illumination radiation 16 can also be incident on the back side 316. In principle, the stop 302 is aligned in the beam path 114, 218 as desired. The illumination radiation 16 introduces heat Q into the stop 302. As a result, the stop 302 may heat up non-uniformly and may also deform due to heat.

A coating 318 for example suitable for absorbing infrared radiation IR for the purpose of thus introducing heat Q into the stop 302 in a targeted manner may be provided on the front side 314. The coating 318 is optional. Also, the coating 318 can be provided on the back side 316 or on both the front side 314 and the back side 316.

The stop 302 is planar. For example, the stop 302 is a metal sheet. The stop 302 can be a one-piece component, such as one which is materially in one piece. In the present case, "one piece" or "one part" means that the stop 302 forms a single component or a single component part and is not assembled from a plurality of components or component parts. However, this is not mandatory. In the present case "materially in one piece" means that the stop 302 is produced from the same material throughout.

However, in an alternative, the stop 302 can also be constructed from a plurality of planar or sheet-shaped elements 320, 322, which are placed onto one another and securely connected to one another. For example, the elements 320, 322 are riveted, screwed or adhesively bonded to one another. For example, the elements 320, 322 are manufactured from different metal alloys, with the result that, on account of different coefficients of thermal expansion of the various metal alloys, the elements expand to different extents in the case of an input of heat Q. This enables a targeted deformation of the stop 302. In that case, the stop 302 is a bimetal stop. The elements 320, 322 can have different thicknesses, as shown in FIG. 7, or identical thicknesses (not shown).

The stop arrangement 300 or the stop 302 also comprises a heating device 324. For example, the heating device 324 comprises a radiant heater 326 which emits infrared radiation IR, the infrared radiation for example being incident on the front side 314, for example on the coating 318, in order to introduce heat Q into the stop 302 in a targeted manner.

The heating device 324 can also comprise a heating structure 328 provided directly on the stop 302. The heating structure 328 can be provided directly on the stop 302. The heating structure 328 can be a resistance heater. For example, the heating structure 328 can be supplied with power via the holders 306, 308, 310, 312. The heating structure 328 is optional. The heating structure 328 can be provided in addition to the radiant heater 326 or as an alternative to the radiant heater 326.

The heating device 324 makes it possible to introduce different amounts of heat Q into different regions 330, 332 of the stop 302. Further, the stop 302 for example comprises at least one temperature sensor 334 and at least one photocell or a photo element 336. Any desired number of temperature sensors 334 and any desired number of photo elements 336 can be provided. Further, an infrared camera 338 can also be provided.

It is possible to evaluate sensor signals or measurement signals from the temperature sensor 334, the photo element 336 and/or the infrared camera 338 using an open-loop and closed-loop control device 340, and the heating device 324 can be suitably controlled by the latter.

The targeted introduction of heat Q into the stop 302 via the heating device 324 makes it possible to deform the stop 302 from an initial shape or initial geometry Z1 into a design shape or design geometry Z2. The initial geometry Z1 and the design geometry Z2 differ from one another in terms of the shape or geometry of the light-determining edge 304. In this case, the light-determining edge in the design geometry Z2 is provided with reference sign 304' in FIG. 6. In the design geometry Z2, the light-determining edge 304' can adopt any desired three-dimensional shape.

As mentioned above, the stop 302 absorbs at least some of the illumination radiation 16. This already introduces heat Q into the stop 302. A heater able to compensate changes in the absorbed used power, and hence temperature variations, can be implemented for the stop 302, in particular at least for the obscuration stop 112, but optionally also for the NA stop 110, 212 or the extraneous light stop 224, via the heating device 324.

Structure size variations and telecentricity errors on account of varying stop shape or stop geometry can be substantially eliminated as a result. This yields a stable imaging behavior. In this case, the stop 302 is shaped such that, when the thermal expansion occurring in the process is taken into account, the stop adopts the design geometry Z2 precisely in the case of this maximal absorbed power.

Moreover, it is however also possible to use the targeted introduction of the heat Q into the stop 302 to deliberately influence structure sizes or structure layers by virtue of using the stop temperature as a manipulator and adapting a size of the stop 302 to the given imaging situation using the heating device 324. If the stop 302 is designed as a bimetal element or bimetal stop, it is possible to induce a stronger, potentially useful change in shape or change in geometry of the stop 302 in a targeted manner.

Heating the stop 302 itself can be implemented by irradiating the latter in a targeted manner, for instance using infrared radiation IR, wherein an irradiated region 330, 332 can be ideally restricted to a stop area and the coating 318 with a high absorptivity at the chosen heating wavelength can be attached there.

However, in an alternative or in addition, it is also possible to implement electrical resistance heating in the form of the heating structure 328. To this end, the electrical resistance of the stop 302 is chosen to be high by virtue of the heating structure 328 being insulated vis-à-vis the remaining metal body of the stop 302, for example via an insulator, and only the heating structure 328 being electrically connected. As mentioned previously, power is supplied here via the holders 306, 308, 310, 312.

The stop 302 can be heated largely homogenously. However, there is also the option of heating the stop 302 in locally variable fashion. For example, it is possible to heat only the regions 330, 332 or one of the regions 330, 332. Thus, horizontally oriented structures diffract upward and downward while vertical lines diffract to the left and right. Accordingly, a thermal load on the stop 302 following the absorption of superaperture light from such structures emerges in an upper/lower or lateral portion of the stop 302, while the respectively complementary region absorbs no light or at least significantly less light.

As a consequence there is an inhomogenous temperature distribution on the stop 302 which, if no countermeasure is taken, may lead to a non-uniform change in shape on account of the thermal expansion of the stop material. While the reduction of a homogenous preheating power guides the mean temperature of the stop 302 into the target range, this homogenous heating power, however, cannot provide any compensation for these local variations. Precisely this option is created with the aid of a locally variable preheating power.

In the cases explained, diffraction at horizontal structures would lead to the removal of the preheating power or the reduction of the preheating power in a manner adapted to the power absorbed from the superaperture light from the upper and lower stop regions, but the preheating power would be maintained in the lateral areas. Overall, a temperature field of the stop 302 remains largely unchanged. The imaging behavior of the optical system 100, 200 is not impaired by any change in stop shape. The optical system 100, 200 reacts completely analogously to diffraction at vertically oriented structures when the separately supplied heating power is reduced in the lateral areas when the heating power is maintained at the top and bottom.

The diffraction distribution generated at the reticle 7 during the operation of the optical system 100, 200 may be largely known. Even if the reticle structures are handled in proprietary fashion, the focus areas in the diffraction light can be deduced relatively reliably, for instance on the basis of using x- or y-dipole structures, because the illuminations are adapted carefully to the current reticle structures (source mask optimization, SMO). However, at the same time, situations also arise, for instance with mixed structures on the reticle 7, where it is not possible to sufficiently accurately predict the diffraction angle distribution on which local heating can be based.

For such situations, it is possible, as mentioned previously, to integrate temperature sensors 334 in the stop 302. Specifically for a design with an electrical resistance heater, the heating structure 328 can also be used as a temperature sensor by virtue of its temperature-dependent resistance. For example, this can be implemented with the aid of bridge circuits.

However, in an alternative or in addition, in the case of a particularly stringent desired accuracy, it is also possible to observe the stop 302 or regions thereof using the infrared camera 338 and use this signal to deduce the optimal local preheating power. Additionally, photo elements 336 which directly measure the intensity of the incident illumination radiation 16 can be arranged, with a view of the incident illumination radiation 16, on the stop 302 itself.

If the stop 302 is an obscuration stop, then the measurement signal can be read out by radio, or the signal is conducted via at least one of the holders 306, 308, 310, 312, in order to avoid lots of structures in the beam path 114, 218. If the photo element 336 uses a power supply, the latter can be implemented inductively in contactless fashion, by radiating light on a photovoltaic structure or, optionally, yet again via at least one of the holders 306, 308, 310, 312.

If the temperature distribution is measured on pupil-proximate optical elements, then the measurement results allow a conclusion to be drawn about the used light power absorbed locally in the region of the pupil, and hence also about the local distribution thereof. This information can also be used to realize open-loop or closed-loop control, which is as precise as possible, of the locally variable heating power on the stop 302. If the stop 302 is near the field or at an intermediate position, correspondingly, information from optical elements at comparable positions in the beam path are useful.

If the stop 302 is designed as a manipulator, it can be incorporated in the general correction procedure. To this end, sensitivities are ascertained in a first step. This can be implemented on the basis of optical simulations which use the power received and the thermal link to calculate a change in temperature. This is used to calculate a change in shape, the latter is used to calculate an effect in the exit pupil AP, AP1 or/and a field intensity profile, and this in turn is used to optionally calculate in a structure-dependent and illumination-dependent manner changes in structure size.

During the operation of the optical system 100, 200, it is now possible to obtain information regarding the current structure size deviation from a target value. This can be implemented by a timely measurement of a semiconductor structure which has just been manufactured. Alternatively, wavefront measurements can be used to ascertain effects on the structure size, which should be compensated, using sensitivities determined for the wavefront measurements as a starting point, for instance on the basis of a Zernike description.

The thermal sensitivities of the stop 302 are considered during the optimization, together with the sensitivities of conventional manipulators, for example displaceable, tiltable or/and deformable optical elements, and a manipulator displacement path recipe is determined, the latter proposing a manipulation of the various mechanisms which can be with respect to a given target function and then also includes a change in temperature of the stop 302. This manipulator displacement path recipe is implemented accordingly.

Figure 8:
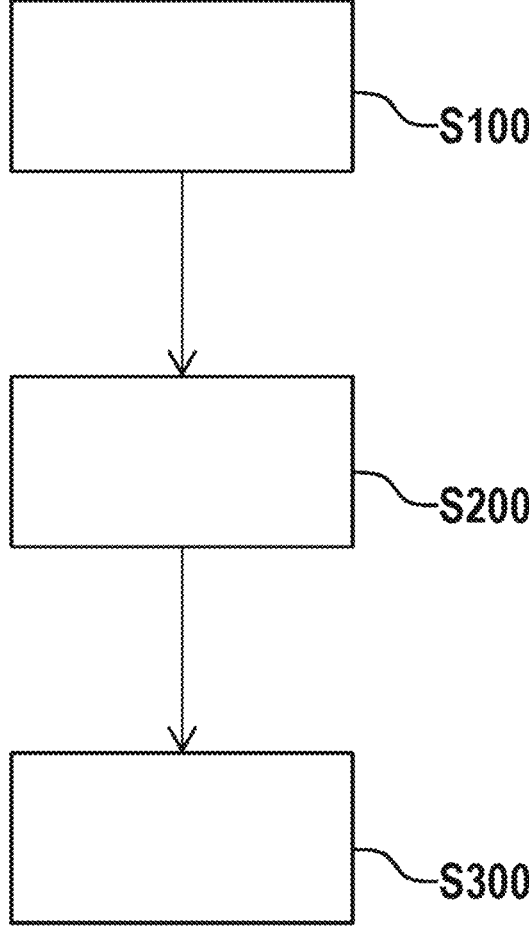
FIG. 8 shows a schematic block diagram of an embodiment of a method for operating the optical system according to FIG. 2 or FIG. 4.

FIG. 8 shows a schematic block diagram of an embodiment of a method for operating the optical system 100, 200.

In the method, the stop 110, 112, 212, 224, 302 is provided in a step S100. In this case, at least portions of the stop 110, 112, 212, 224, 302 are arranged in the respective beam path 114, 218 of the optical system 100, 200 such that at least portions of the beam path 114, 218 are shaded by the stop 110, 112, 212, 224, 302.

In a step S200, heat Q is introduced into the stop 110, 112, 212, 224, 302 with the aid of the heating device 324, for example with the aid of the radiant heater 326 and/or the heating structure 328. In a step S300, the stop 110, 112, 212, 224, 302 deforms from the initial geometry Z1 into the design geometry Z2 as a result of the introduction of the heat Q. The deformation occurs on account of a heat-related expansion of the stop 110, 112, 212, 224, 302.

For example, different amounts of heat Q can be introduced into different regions 330, 332 of the stop 110, 112, 212, 224, 302 in step S200. Further, a predetermined heating power ratio of the different regions 330, 332 can be set in step S200.

Moreover, in step S200, a local stop temperature distribution of the stop 110, 112, 212, 224, 302 can be determined on the basis of measurement signals from the temperature sensor 334, the photo element 336 and/or the infrared camera 338 and/or on the basis of information relating to a temperature distribution of further optical elements, especially mirrors 124, M1 to M6, arranged at a comparable position to the stop 110, 112, 212, 224, 302 in the beam path 114, 218, and the heating device 324 can be controlled in such a way that a desired target stop temperature distribution of the stop 110, 112, 212, 224, 302 is obtained.

Further, in step S200, the introduction of the heat Q can be used to implement an open-loop and/or closed-loop control which, even in the case of varying absorption of illumination radiation 16 during the operation of the optical system 100, 200, keeps a stop temperature of the stop 110, 112, 212, 224, 302 in a temperature corridor of 10 K, such as of 5 K, for example of 2 K. The open-loop and closed-loop control device 340 can be used to this end. In the present case, a "temperature corridor" should be understood to mean a tolerance field or a tolerance range, in which the stop temperature is kept.

In step S200, the stop temperature can be incorporated as a structure size manipulator in an optimization method of the optical system 100, 200 on the basis of predetermined sensitivities and can be adapted time-dependently for the purpose of reducing a currently manufactured structure size from a target value.

Although the present disclosure has been described on the basis of exemplary embodiments, it can be modified in diverse ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
100 Optical system
102 Object plane
104 Pupil plane
106 Field plane
108 Used field
110 Stop/NA stop
112 Stop/obscuration stop
114 Beam path
116 Operating light
118 Aperture
120 Light-determining edge
122 Light-determining edge
124 Mirror
126 Obscuration
200 Optical system
202 Object plane
204 Pupil plane
206 Intermediate image plane
208 Field plane
210 Used field
212 Stop/NA stop
214 Aperture
216 Light-determining edge
218 Beam path

220 Operating light
222 Housing
224 Stop/extraneous light stop
226 Aperture
228 Light-determining edge
300 Stop arrangement
302 Stop/obscuration stop
304 Light-determining edge
304' Light-determining edge
306 Holder
308 Holder
310 Holder
312 Holder
314 Front side
316 Back side
318 Coating
320 Element
322 Element
324 Heating device
326 Radiant heater
328 Heating structure
330 Region
332 Region
334 Temperature sensor
336 Photo element
338 Infrared camera
340 Open-loop and closed-loop control device
AP Exit pupil
AP1 Exit pupil
AP2 Intermediate image pupil
AP3 Intermediate image pupil
EP Entrance pupil
EP1 Entrance pupil
EP2 Entrance pupil
F Field point
F1 Field point
F2 Field point
F3 Field point
LR Infrared radiation
LR Light direction
L1 Light
L2 Extraneous light
M Center
M1 Mirror
M2 Mirror
M3 Mirror
M4 Mirror
M5 Mirror
M6 Mirror
O Object point
OV Virtual object point
P Point
Q Heat
R Direction
S1 Light ray
S2 Light ray
S3 Light ray
S4 Light ray
S5 Light ray
S6 Light ray
S10 Light ray
S20 Light ray
S30 Light ray
S40 Light ray
S50 Light ray
S60 Light ray
S60' Light ray S60" Light ray
S100 Step
S200 Step
S300 Step
V Direction vector
W Angular space
W1 Angular space
W2 Angular space
W3 Angular space
W4 Angular space
W5 Angular space
x x-direction
y y-direction
z z-direction
Z1 Initial geometry
Z2 Design geometry
θ Opening angle
θmax Opening angle
φ Circumferential angle

What is claimed is:

1. An optical system, comprising:
a stop selected from the group consisting of an obscuration stop, a stop for the numerical aperture and an extraneous light stop, at least portions of the stop being arranged in a beam path of the optical system to shade at least portions of the beam path;
a heating device configured to introduce heat into the stop to deform the stop from an initial geometry to a design geometry;
a temperature sensor, a photo element and/or an infrared camera; and
a control device configured to:
  i) determine a local stop temperature distribution of the stop based on: a) measurement signals from the temperature sensor, the photo element and/or the infrared camera; and/or b) information relating to a temperature distribution of further optical elements arranged at a comparable position to the stop in the beam path; and
  ii) control the heating device to obtain a target stop temperature distribution of the stop.

2. The optical system of claim 1, wherein the heating device comprises a radiant heater configured to irradiate the stop with electromagnetic radiation.

3. The optical system of claim 1, wherein the heating device comprises a radiant heater configured to irradiate the stop with infrared radiation.

4. The optical system of claim 1, wherein the heating device comprises a heating structure connected to the stop.

5. The optical system of claim 4, wherein the heating structure is configured to be supplied with power via holders of the stop.

6. The optical system of claim 1, wherein the heating device is configured to introduce different amounts of heat into different regions of the stop.

7. The optical system of claim 1, wherein measurement signals from the temperature sensor and/or the photo element are transmittable via holders of the stop, and/or wherein measurement signals from the temperature sensor and/or the photo element are wirelessly transmittable.

8. The optical system of claim 1, wherein the stop comprises a light-absorbing coating.

9. The optical system of claim 1, wherein the stop comprises an obscuration stop.

10. The optical system of claim 1, wherein the stop comprises a stop for the numerical aperture.

11. The optical system of claim 1, wherein the stop comprises an extraneous light stop.

12. The optical system of claim 1, wherein the control device is an open-loop and closed-loop control device.

13. The optical system of claim 1, wherein the control device is configured to determine a local stop temperature distribution of the stop based on measurement signals from the temperature sensor, the photo element and/or the infrared camera.

14. The optical system of claim 13, wherein the control device is configured to determine a local stop temperature distribution of the stop based on information relating to a temperature distribution of further optical elements arranged at a comparable position to the stop in the beam path.

15. The optical system of claim 1, wherein the control device is configured to determine a local stop temperature distribution of the stop based on information relating to a temperature distribution of further optical elements arranged at a comparable position to the stop in the beam path.

16. An apparatus, comprising:
an optical system according to claim 1,
wherein the apparatus is a projection exposure apparatus.

17. A method, comprising:
a) providing a stop selected from the group consisting of an obscuration stop, a stop for the numerical aperture and an extraneous light stop, at least portions of the stop being arranged in a beam path of an optical system for a projection exposure apparatus so that at least portions of the beam path are shaded by the stop;
b) introducing heat into the stop using a heating device; and
c) deforming the stop from an initial geometry to a design geometry with the aid of the heat,
wherein b) comprises determining a local stop temperature distribution of the stop based on: i) measurement signals from a temperature sensor, a photo element and/or an infrared camera; and/or ii) information relating to a temperature distribution of further optical elements arranged at a comparable position to the stop in the beam path, and
wherein the method further comprises controlling the heating device to obtain a target stop temperature distribution of the stop.

18. The method of claim 17, wherein b) comprises introducing different amounts of heat into different regions of the stop.

19. The method of claim 18, wherein b) comprises setting a predetermined heating power ratio of the different regions.

20. The method of claim 17, wherein b) comprises using the introduction of the heat to implement an open-loop and/or closed-loop control which, when varying an absorption of illumination radiation during the operation of the optical system, keeps a stop temperature of the stop in a temperature corridor of 10 K.

21. The method of claim 20, wherein b) comprises:
incorporating the stop temperature as a structure size manipulator in an optimization method of the optical system based on predetermined sensitivities; and
time-dependently adapting the stop temperature to reduce a deviation of a currently manufactured structure size from a target value.

* * * * *